United States Patent
Sinanoglu

(10) Patent No.: US 9,599,671 B2
(45) Date of Patent: Mar. 21, 2017

(54) ARCHITECTURE, SYSTEM, METHOD, AND COMPUTER-ACCESSIBLE MEDIUM FOR PARTIAL-SCAN TESTING

(75) Inventor: Ozgur Sinanoglu, Abu Dhabi (AE)

(73) Assignee: New York University, New York, NY (US)

( * ) Notice: Subject to any disclaimer, the term of this patent is extended or adjusted under 35 U.S.C. 154(b) by 1104 days.

(21) Appl. No.: 13/368,926

(22) Filed: Feb. 8, 2012

(65) Prior Publication Data

US 2012/0221284 A1 Aug. 30, 2012

Related U.S. Application Data

(60) Provisional application No. 61/446,268, filed on Feb. 24, 2011.

(51) Int. Cl.
*G01R 31/3177* (2006.01)
*G01R 31/3185* (2006.01)

(52) U.S. Cl.
CPC . *G01R 31/318544* (2013.01); *G01R 31/3177* (2013.01); *G01R 31/318547* (2013.01); *G01R 31/318586* (2013.01)

(58) Field of Classification Search
CPC .............. G01R 31/318583; G01R 31/318586
USPC .......................................................... 707/17
See application file for complete search history.

(56) References Cited

U.S. PATENT DOCUMENTS

| | | | | |
|---|---|---|---|---|
| 2003/0149927 A1* | 8/2003 | Wang | ........................... | 714/738 |
| 2004/0153978 A1* | 8/2004 | Xiang et al. | ....................... | 716/3 |
| 2005/0081130 A1* | 4/2005 | Rinderknecht et al. | ...... | 714/726 |
| 2007/0011514 A1* | 1/2007 | Vranken et al. | .............. | 714/724 |
| 2008/0052578 A1* | 2/2008 | Rajski | ............ | G01R 31/318335 714/729 |
| 2008/0263423 A1* | 10/2008 | Ward | ........................... | 714/738 |
| 2010/0083199 A1* | 4/2010 | Wohl | ............. | G01R 31/318547 716/136 |
| 2011/0022907 A1* | 1/2011 | Jiang | .............. | G01R 31/318519 714/725 |

OTHER PUBLICATIONS

Karp et al., A Fast Parallel Algorithm for the Maximal Independent Set Problem, Journal of the Association for Computing Machinery, vol. 32, No. 4, Oct. 1985, pp. 762-773.*
Park et al., New Method for Partial Scan Design Based on Propagation and Justification Requirements of Faults, International Test Conference Paper 19.2, 0-7803-2991-0195, 1995 IEEE, pp. 413-422.*

(Continued)

*Primary Examiner* — Gregory J Toatley
*Assistant Examiner* — Michael Dalbo
(74) *Attorney, Agent, or Firm* — Andrews Kurth Kenyon LLP

(57) ABSTRACT

Exemplary method, computer-accessible medium, test architecture, and system can be provided for a partial-scan test of at least one integrated circuit. For example, it is possible to obtain a plurality of test cubes using a first combinational automatic test pattern generation (ATPG) and identify at least one flip-flop of the integrated circuit using the test cubes to convert to a non-scan flip-flop and facilitate the partial-scan test to utilize the cubes without a utilization of a sequential ATPG or a second combinational ATPG.

30 Claims, 4 Drawing Sheets

Test cube analysis mapped to the independent set problem

(56) References Cited

OTHER PUBLICATIONS

Xiang et al., Partial Scan Design Based on Circuit State Information and Functional Analysis, IEEE Transactions on Computers, vol. 53, No. 3, Mar. 2004, pp. 276-287.*

Kalla et al. "A comprehensive approach to the partial scan problem using implicit state enumeration," IEEE Transactions on Computer-Aided Design of Integrated Circuits and Systems, vol. 21, No. 7, pp. 810-826, Jul. 2002.

Chickermane et al. "An optimization based approach to the partial scan design problem," International Test Conference, pp. 377-386, Sep. 1990.

Chickermane et al. "A fault oriented partial scan design approach," International Conference on Computer-Aided Design, pp. 400-403, Nov. 1991.

Xiang et al. "A global algorithm for the partial scan design problem using circuit state information," International Test Conference, pp. 548-557, Oct. 1996.

Park et al. "A new method for partial scan design based on propagation and justification requirements of faults," International Test Conference, pp. 413-422, Oct. 1995.

Park et al. "A partial scan design by unifying structural analysis and testabilities," International Symposium on Circuits and Systems, vol. 1, pp. 88-91, 2000.

Cheng et al. "A partial scan method for sequential circuits with feedback," IEEE Transactions on Computers, vol. 39, No. 4, pp. 544-548, Apr. 1990.

Tai et al. "A three-stage partial scan design method using the sequential circuit flow graph," International Conference on VLSI Design, pp. 101-106, Jan. 1994.

Kunzmann et al. "An analytical approach to the partial scan design problem," Journal of Electronic Testing: Theory and Applications, vol. 1, pp. 163-174, 1990.

Liang et al. "An effective methodology for mixed scan and reset design based on test generation and structure of sequential circuits," Asian Test Symposium, pp. 173-178, 1999.

Chakradhar et al. "An exact algorithm for selecting partial scan flip-flops," Design Automation Conference, pp. 81-86, Jun. 1994.

Sharma et al. "Combination of structural and state analysis for partial scan," International Conference on VLSI Design, pp. 134-139, 2001.

Agrawal et al. "Designing circuits with partial scan," IEEE Design Test of Computers, vol. 5, No. 2, pp. 8-15, Apr. 1988.

Lin et al. "Full scan fault coverage with partial scan," Design, Automation and Test in Europe, pp. 468-472, 1999.

Ashar et al. "Implicit computation of minimum-cost feedback-vertex sets for partial scan and other applications," Design Automation Conference, pp. 77-80, Jun. 1994.

Lee et al. "On determining scan flip-flops in partial-scan, designs," International Conference on Computer-Aided Design, pp. 322-325, Nov. 1990.

Saund et al. "Partial scan beyond cycle cutting," International Symposium on Fault-Tolerant Computing, pp. 320-328, Jun. 1997.

Kim et al. "Partial scan by use of empirical testability," International Conference on Computer-Aided Design, pp. 314-317, Nov. 1990.

Xiang et al. "Partial scan design based on circuit state information and functional analysis," IEEE Transactions on Computers, vol. 53, No. 3, pp. 276-287, Mar. 2004.

Xiang et al. "Partial scan design based on circuit state information," Design Automation Conference, pp. 807-812, Jun. 1996.

Boppana et al. "Partial scan design based on state transition modeling," International Test Conference, pp. 538-547, Oct. 1996.

Hsiao et al. "Partial scan selection based on dynamic reachability and observability information," International Conference on VLSI Design, pp. 174-180, Jan. 1998.

Kagaris et al. "Retiming-based partial scan," IEEE Transactions on Computers, vol. 45, No. 1, pp. 74-87, Jan. 1996.

Cheng "Single clock partial scan," IEEE Design Test of Computers, vol. 12, No. 2, pp. 24-31, 1995.

Khan et al. "Spartan: A spectral and information theoretic approach to partial scan," International Test Conference, p. Paper 21.1, 2007.

Touba "Survey of test vector compression techniques," IEEE Design Test of Computers, vol. 23, No. 4, pp. 294-303, Apr. 2006.

Abramovici et al. "Testability-based partial scan analysis," Journal of Electronic Testing: Theory and Applications, vol. 7, pp. 47-60, Aug. 1995.

Gupta et al. "The ballast methodology for structured partial scan design," IEEE Transactions on Computers, vol. 39, No. 4, pp. 538-544, Apr. 1990.

Abramovici et al. "The best flip-flops to scan," International Test Conference, p. 166, Oct. 1991.

Rearick "The case for partial scan," International Test Conference, p. 1032, Nov. 1997.

Cheng "Timing-driven partial scan," International Conference on Computer-Aided Design, pp. 404-407, Nov. 1991.

N. A. Touba "Survey of test vector compression techniques," IEEE Design Test of Computers, vol. 23, No. 4, pp. 294-303, Apr. 2006.

R. E. Tarjan et al. "Finding a maximum independent set," SIAM Journal of Computing, vol. 3, pp. 537-546, 1977.

Z. You et al. "A response compactor for extended compatibility scan tree construction," International Conference on ASIC, pp. 609-612, Oct. 2009.

E. Trischler "Incomplete scan path with an automatic test generation methodology," International Test Conference, pp. 153-162, 1980.

* cited by examiner

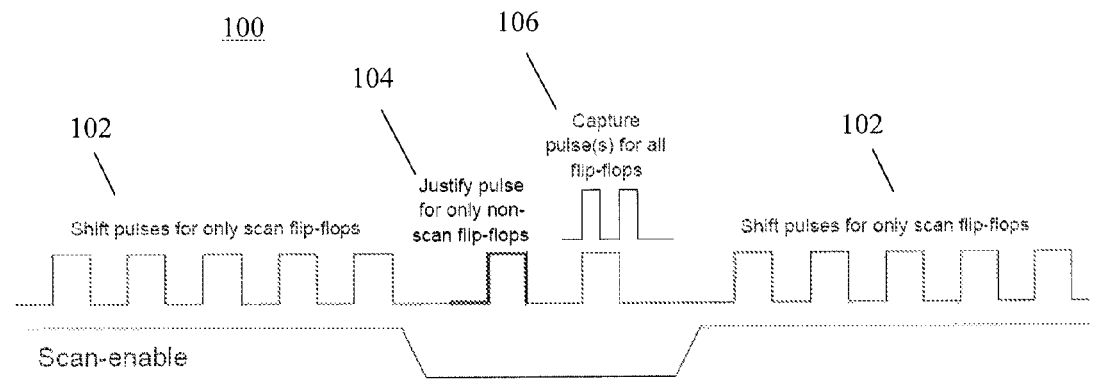
Figure 1. Clocking in the proposed partial scan scheme
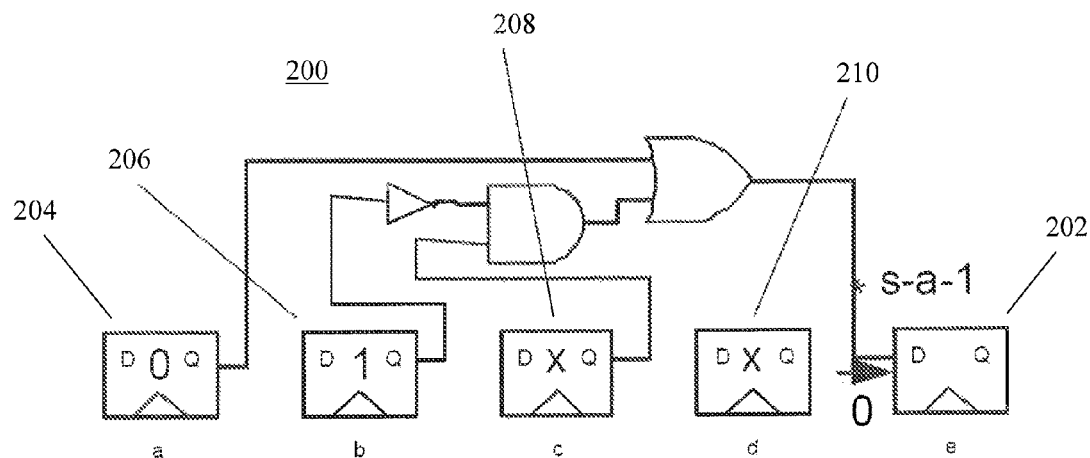
Figure 2. Justification of a flip-flop through functional paths

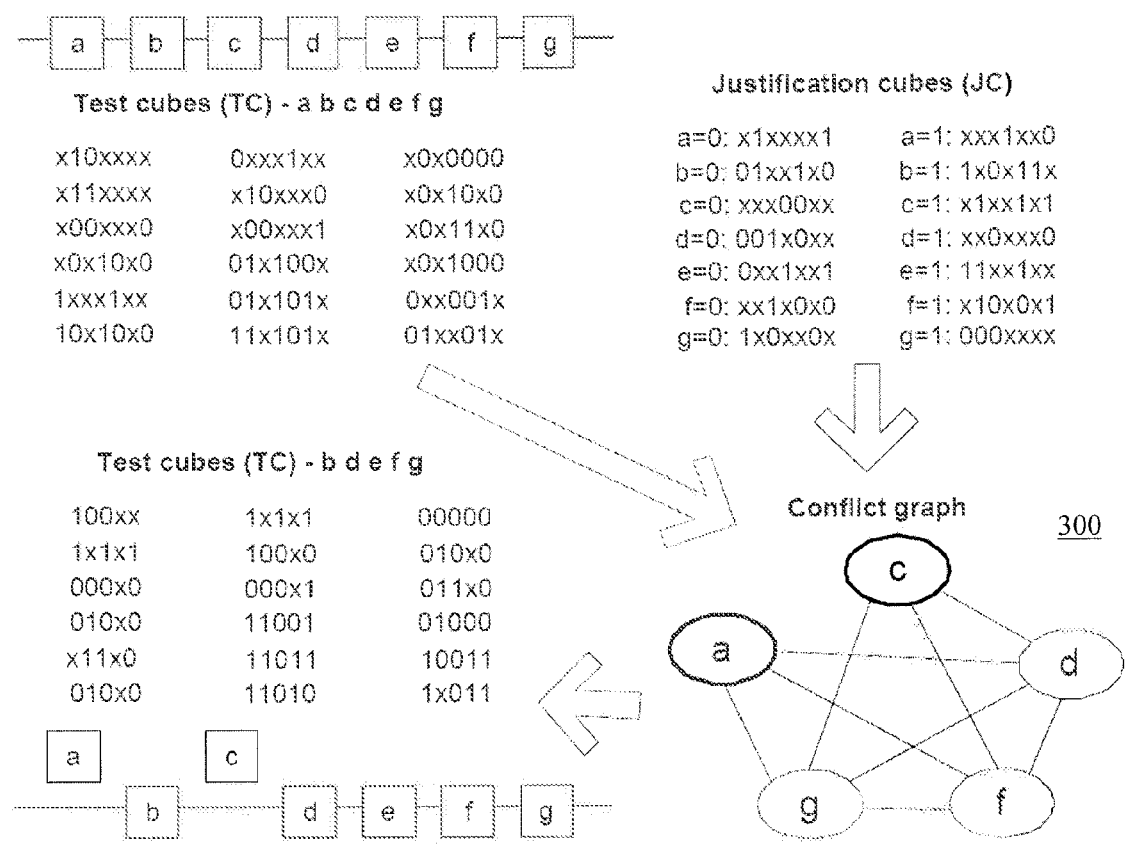
Figure 3. Test cube analysis mapped to the independent set problem

US 9,599,671 B2

ARCHITECTURE, SYSTEM, METHOD, AND COMPUTER-ACCESSIBLE MEDIUM FOR PARTIAL-SCAN TESTING

CROSS-REFERENCE TO PRIOR APPLICATIONS

This application claims priority to U.S. Provisional Application Ser. No. 61/446,268, filed on Feb. 24, 2011, which is incorporated by reference herein in its entirety.

FIELD OF THE DISCLOSURE

Exemplary embodiments of the present disclosure relate to testing of integrated circuits and more specifically to exemplary systems, methods, test architecture, and computer readable medium for partial-scan testing.

BACKGROUND INFORMATION

Increasing complexity of integrated circuits has generally forced the industry to abandon partial scan, which can remove scan multiplexers corresponding to some of the flip-flops, disconnecting them from the scan path. As a result, controllability and observability of these flip-flops can be compromised, typically necessitating sequential Automatic Test Pattern Generation (ATPG), where these flip-flops can be controlled and observed through functional paths. The computational cost of sequential ATPG typically cannot be afforded, given the complexity of integrated circuits today. Consequently, the industry has generally given up on partial scan, and adopted full scan despite its costs.

Full scan typically incurs area, performance and test costs. An insertion of as many multiplexers as the number of flip-flops in the design can impose a considerable area cost. Furthermore, these multiplexers are typically inserted on functional paths, resulting in critical path prolongation by a multiplexer delay, and hence degrading the performance of the design timing-wise. Full scan can also incur significant test costs. Every test pattern can include as many bits as the number of flip-flops in the design, translating into high test time and test data volume. Another problem that full scan imposes can be the excessive switching activity during test, as all the flip-flops are active during shift operations. Elevated levels of power dissipation (see, e.g., P. Girard, "Survey of low-power testing of VLSI circuits," IEEE Design Test of Computers, vol. 19, no. 3, pp. 80-90, May 2002) occur during testing, which, if overlooked, can cause reliability issues.

A computationally efficient partial scan can be a remedy of the problems of full scan (see, e.g., J. Rearick, "The case for partial scan," International Test Conference, p. 1032, November 1997). Removal of scan multiplexers, and thus taking some of the flip-flops off the scan path can:

Reduce area cost.
Potentially improve the critical paths of the design, and thus, can enhance functional performance.
Reduce the scan path length, and thus, can decrease test time and test data volume. It can be a form of test data compression.
Reduce switching activity during testing and can leash power dissipation and IR drop, as only the scan flip-flops typically toggle during shift operations while the non-scan flip-flops can be inactive during shift.

Research has also been conducted in partial scan design. The previously proposed techniques in this field can be classified mainly into three categories: (a) structure-based techniques that typically involves breaking the cycles and/or reducing scan depth (see, e.g., P. Ashar and S. Malik, "Implicit computation of minimum-cost feedback-vertex sets for partial scan and other applications," Design Automation Conference, pp. 77-80, June 1994; S. T. Chakradhar, A. Balakrishnan, and V. D. Agrawal, "An exact algorithm for selecting partial scan flip-flops," Design Automation Conference, pp. 81-86, June 1994; K.-T. Cheng and V. D. Agrawal, "A partial scan method for sequential circuits with feedback," IEEE Transactions on Computers, vol. 39, no. 4, pp. 544-548, April 1990; K.-T. Cheng, "Single clock partial scan," IEEE Design Test of Computers, vol. 12, no. 2, pp. 24-31, 1995; V. Chickermane and J. H. Patel, "An optimization based approach to the partial scan design problem," International Test Conference, pp. 377-386, September 1990; V. Chickermane and J. H. Patel, "A fault oriented partial scan design approach," International Conference on Computer-Aided Design, pp. 400-403, November 1991; R. Gupta and M. A. Breuer, "The ballast methodology for structured partial scan design," IEEE Transactions on Computers, vol. 39, no. 4, pp. 538-544, April 1990; A. Kunzmann and H. J. Wunderlich, "An analytical approach to the partial scan design problem," Journal of Electronic Testing: Theory and Applications, vol. 1, pp. 163-174, 1990; D. H. Lee and S. M. Reddy, "On determining scan flip-flops in partial-scan designs," International Conference on Computer-Aided Design, pp. 322-325, November 1990; J. Park, S. Shin, and S. Park, "A partial scan design by unifying structural analysis and testabilities," International Symposium on Circuits and Systems, vol. 1, pp. 88-91, 2000; and S.-E. Tai and D. Bhattacharya, "A three-stage partial scan design method using the sequential circuit flow graph," International Conference on VLSI Design, pp. 101-106, January 1994), (b) testability-based techniques that select scan flip-flops based on testability improvements (see, e.g., V. Chickermane and J. H. Patel, "An optimization based approach to the partial scan design problem," International Test Conference, pp. 377-386, September 1990; V. Chickermane and J. H. Patel, "A fault oriented partial scan design approach," International Conference on Computer-Aided Design, pp. 400-403, November 1991; M. Abramovici, J. J. Kulikowski, and R. K. Roy, "The best flip-flops to scan," International Test Conference, p. 166, October 1991; V. Boppana and W. K. Fuchs, "Partial scan design based on state transition modeling," International Test Conference, pp. 538-547, October 1996; P. Kalla and M. Ciesielski, "A comprehensive approach to the partial scan problem using implicit state enumeration," IEEE Transactions on Computer-Aided Design of Integrated Circuits and Systems, vol. 21, no. 7, pp. 810-826, July 2002; K. S. Kim and C. R. Kime, "Partial scan by use of empirical testability," International Conference on Computer-Aided Design, pp. 314-317, November 1990; P. S. Parihk and M. Abramovici, "Testability-based partial scan analysis," Journal of Electronic Testing: Theory and Applications, vol. 7, pp. 47-60, August 1995; G. S. Saund, M. S. Hsiao, and J. H. Patel, "Partial scan beyond cycle cutting," International Symposium on Fault-Tolerant Computing, pp. 320-328, June 1997; E. Trischler, "Incomplete scan path with an automatic test generation methodology," International Test Conference, pp. 153-162, 1980; D. Xiang, S. Venkataraman, W. K. Fuchs, and J. H. Patel, "Partial scan design based on circuit state information," Design Automation Conference, pp. 807-812, June 1996; D. Xiang and J. H. Patel, "A global algorithm for the partial scan design problem using circuit state information," International Test Conference, pp. 548-557, October 1996; and D. Xiang and J. H. Patel, "Partial scan design based on circuit state information and functional analysis," IEEE Transactions on Computers, vol. 53, no. 3, pp. 276-287, March 2004), and (c) test generation-based techniques which intertwine test generation and scan flip-flop selection (see, e.g., V. D. Agrawal, K.-T. Cheng, D. D. Johnson, and T. S. Lin, "Designing circuits with partial scan," IEEE Design Test of Computers, vol. 5, no. 2, pp. 8-15, April 1988; M. S. Hsiao, G. S. Saund, E. M. Rudnick, and J. H. Patel, "Partial scan selection based on dynamic reachability and observability information," International Conference on VLSI Design, pp. 174-180, January 1998; H.-C. Liang and C. L. Lee, "An effective methodology for mixed scan and reset design based on test generation and structure of sequential circuits," Asian Test Symposium, pp. 173-178, 1999; X. Lin, I. Pomeranz, and S. M. Reddy, "Full scan fault coverage with partial scan," Design, Automation and Test in Europe, pp. 468-472, 1999; I. Park, D. S. Ha, and G. Sim, "A new method for partial scan design based on propagation and justification requirements of faults," International Test Conference, pp. 413-422, October 1995; and S. Sharma and M. S. Hsiao, "Combination of structural and state analysis for partial scan," International Conference on VLSI Design, pp. 134-139, 2001). Other partial scan techniques can include those driven by layout constraints (see, e.g., V. Chickermane and J. H. Patel, "An optimization based approach to the partial scan design problem," International Test Conference, pp. 377-386, September 1990), timing constraints (see, e.g., J.-Y. Jou and K.-T. Cheng, "Timing-driven partial scan," International Conference on Computer-Aided Design, pp. 404-407, November 1991), re-timing (see, e.g., S. T. Chakradhar, A. Balakrishnan, and V. D. Agrawal, "An exact algorithm for selecting partial scan flip-flops," Design Automation Conference, pp. 81-86, June 1994 and D. Kagaris and S. Tragoudas, "Retiming-based partial scan," IEEE Transactions on Computers, vol. 45, no. 1, pp. 74-87, January 1996), and toggling rate of flip-flops and entropy measures (see, e.g., O. Khan, M. L. Bushnell, S. K. Devanathan, and V. D. Agrawal, "Spartan: A spectral and information theoretic approach to partial scan," International Test Conference, p. Paper 21.1, 2007). These techniques typically necessitate the utilization of sequential ATPG or combinational ATPG with time frame expansion to generate test patterns on the partially scanned design, not only failing to comply with the existing design/test flow that industry utilizes today but also typically incapable of ensuring the quality of full scan.

SUMMARY OF EXEMPLARY EMBODIMENTS

Exemplary embodiments of the present disclosure can provide a test cube analysis driven partial scan scheme. The exemplary technique can operate on a set of test cubes generated by a combinational Automatic Test Pattern Generation (ATPG) tool, and can identify a maximum number of flip-flops that can be converted to non-scan while delivering the quality of full scan.

By identifying the conditions to recover the controllability and observability compromised due to partial scan, and by formulating these conditions via test cube operations, an exemplary computationally efficient partial scan scheme that is compatible with the conventional ATPG flow can be provided. Upon the identification of the flip-flops that can be converted to non-scan, the test cubes can be post-processed to ensure the delivery of the original set intact into the flip-flops. This simple exemplary post-processing procedure, which can be based on cube merge operations, can reduce or even eliminate the need for an ATPG re-run.

The exemplary partial scan scheme can preferably combine the simplicity of the conventional (full scan-based) ATPG flow, and the area, performance, test time, and test power reduction benefits of partial scan. The removal of scan multiplexers can deliver area as well as performance savings, while the shortening of the scan path can translate into test time and data volume reductions. Furthermore, as the non-scan flip-flops are typically inactive during shift operations, power dissipation in the scan path, in the combinational logic, and in the clock tree can be reduced. The proposed partial scan scheme can be applied in conjunction with test compression and test power reduction techniques to drive the test costs down even further.

Exemplary embodiments of the present disclosure can provide a computationally efficient and design flow compliant partial scan scheme that can deliver the aforementioned area, test cost reduction, and performance benefits while ensuring the quality of a full scan. The exemplary test scheme can be driven by an analysis of test cubes, which can be generated by a combinational ATPG tool, and can identify the flip-flops that can be converted to non-scan while retaining the test quality intact. Upon the conversion of scan flip-flops to non-scan, a simple post-processing of the test cubes can help compute the values to be loaded into the remaining scan flip-flops, typically eliminating the need to re-run ATPG. This way, the proposed partial scan scheme can combine the simplicity of the conventional ATPG flow, and the area, performance and test cost reduction benefits of partial scan.

Assurance of the quality of full scan and the elimination of the need to re-run ATPG on the partially scanned design can render the proposed scheme fully compliant with the design and test flow, and can be uniquely differentiable from the previously proposed partial scan techniques; these features can exist in full scan, and not in the other partial scan approaches proposed earlier.

The challenges that can be engendered in inferring, from only a given set of test cubes, a maximal-sized set of flip-flops that can be converted to non-scan can include the identification of the conditions to restore the controllability and observability compromised due to partial scan, and of the formulation of these conditions in terms of test cube operations. By tackling these challenges, an exemplary embodiment of the present disclosure can provide a partial scan scheme that can offer yet another benefit; as the structural details about the exemplary design are typically not required in this analysis, and instead, the exemplary test scheme/tool preferably operates on a set of test cubes, partial scan implementation can be out-sourced. It can be also noteworthy that the exemplary test cube analysis driven partial scan scheme can be orthogonal and thus fully compatible with other test cost reduction techniques, such as, e.g., test data compression (see, e.g., N. A. Touba, "Survey of test vector compression techniques," IEEE Design Test of Computers, vol. 23, no. 4, pp. 294-303, April 2006) and test power reduction (see, e.g., P. Girard, "Survey of low-power testing of VLSI circuits," IEEE Design Test of Computers, vol. 19, no. 3, pp. 80-90, May 2002), which typically need to be applied subsequently on the test cubes processed by the proposed partial scan, technique.

According to certain exemplary embodiments of the present disclosure, a method, computer-accessible medium, and system can be provided for a partial-scan test of at least one integrated circuit. The exemplary method, computer-accessible medium, and system can include obtaining a plurality of test cubes using a first combinational automatic test pattern generation (ATPG) and identifying at least one flip-flop of the integrated circuit using the test cubes to convert to a non-scan flip-flop and facilitate the partial-scan test to utilize the cubes without a utilization of a sequential ATPG or a second combinational ATPG. The partial-scan test can include a performance of a controllability and an observability associated with a full-scan test of the at least one integrated circuit.

Additionally, the identification procedure can include identifying each flip-flop of the integrated circuit that is individually convertible to a non-scanned flip-flop. The identification procedure of each flip-flop can also include using a plurality of justification cubes to justify each flip-flop to a value and merging the justification cubes, and can further include identifying at least one pair of flip-flops that is convertible to non-scanned flip-flops. According to certain exemplary embodiments, identifying the pair(s) of flip-flops can include merging test cubes associated with the pair(s) of flip-flops. The identification procedure can further include identifying at least one group of flip-flops that is convertible to non-scanned flip-flops and mapping flip-flops of group(s) of flip-flops onto a maximum independent set problem. The mapping flip-flops onto the maximum independent set problem can includes using a conflict graph.

According to certain exemplary embodiments, the method can further include post-processing of the test cubes so as perform the partial-scan test without the second combinational ATPG.

According to yet another exemplary embodiment of the present disclosure, a partial-scan test hardware architecture of an integrated circuit can be provided. The exemplary architecture can include at least one non-scan flip-flops identified using a plurality of test cubes obtained using a first combinational automatic test pattern generation (ATPG) to identify at least one flip-flop of the integrated circuit to convert to a non-scan flip-flop and facilitate the partial-scan test to utilize the plurality of test cubes without a utilization of a sequential ATPG or a second combinational ATPG.

These and other objects, features and advantages of the present disclosure will become apparent upon reading the following detailed description of exemplary embodiments of the present disclosure, when taken in conjunction with the appended drawings and claims.

BRIEF DESCRIPTION OF THE DRAWINGS

Further objects, features and advantages of the present disclosure will become apparent from the following detailed description taken in conjunction with the accompanying drawings showing illustrative embodiments of the present disclosure, in which:

FIG. 1 is an exemplary diagram of clocking according to an exemplary embodiment of the present disclosure;

FIG. 2 is an exemplary diagram of a justification of a flip-flop according to an exemplary embodiment of the present disclosure;

FIG. 3 is a mapping of an exemplary test cube analysis onto a maximum independent set problem according to an exemplary embodiment of the present disclosure;

Figure 4:
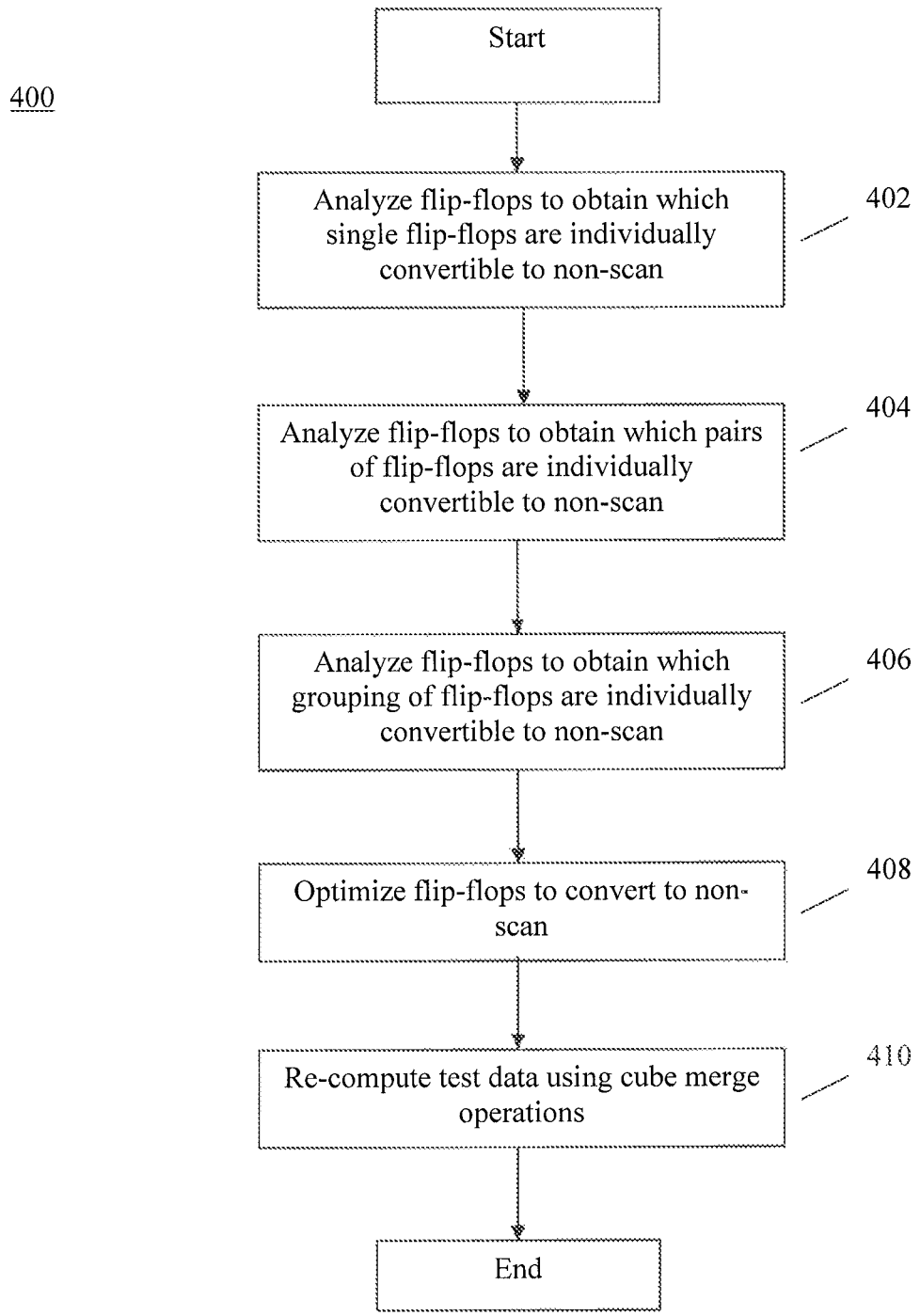
FIG. 4 is a flow diagram of an exemplary embodiment of a method according to the present disclosure.

Throughout the drawings, the same reference numerals and characters, unless otherwise stated, are used to denote like features, elements, components, or portions of the illustrated embodiments. Moreover, while the present disclosure will now be described in detail with reference to the figures, it is done so in connection with the illustrative embodiments and is not limited by the particular embodiments illustrated in the figures, and recited in the claims provided herein.

DETAILED DESCRIPTION OF EXEMPLARY EMBODIMENTS

Exemplary Partial Scan Scheme

A conversion of a scan flip-flop to a non-scan flip-flop can be accomplished by removing the associated scan multiplexer and re-routing the scan chain around the flip-flop, bypassing it. The end-result can be area cost reduction and potentially performance enhancement due to the removal of the multiplexer, in addition to the test time, data volume and power dissipation reductions due to the shortened scan chain; yet, controllability and observability of the converted flip-flop can be compromised with the removal of the multiplexer.

To preserve test quality, the effect of the scan to non-scan conversion can preferably be nullified by restoring the compromised controllability and observability. The latter can be easier to gain back via a simple tap off of the output of the flip-flop as an observation point. Observing the content of the flip-flop through the observation point subsequent to each capture operation can suffice to restore the observability compromised due to scan to non-scan conversion. Furthermore, the observation points corresponding to multiple non-scan flip-flops can be compacted together via a logic cone analysis (see, e.g., Z. You, J. H., M. Inoue, J. Kuang, and H. Fujiwara, "A response compactor for extended compatibility scan tree construction," International Conference on ASIC, pp. 609-612, October 2009) in order to reduce the associated area cost while retaining error detection level intact; error masking can be prevented by compacting the outputs of the flip-flops that have disjoint input cones. The compacted observation points can be multiplexed onto the primary outputs, or can alternatively feed an existing or a dedicated compactor/MISR along with the scan chain(s).

The compromised controllability can be more challenging to restore. With the removal of the scan multiplexer, the non-scan flip-flop is preferably justified, through the functional path driving the flip-flop, to the value desired by a test pattern. In order to render a simple test cube analysis sufficient for the identification of whether and how this justification can be accomplished, any such justification can be constrained to span a single time frame. In the exemplary scheme, a single clock pulse received by the non-scan flip-flops can justify them to the desired value. As the associated functional paths are driven by the scan flip-flops, the justify pulse can be applied after the shift pulses (e.g., upon the completion of the shift-in operations, and thus upon the load of the scan flip-flops) and before the capture pulse(s) (so that the non-scan flip-flops can be also loaded through the functional paths prior to capture).

The clocking 100 of the flip-flops in the exemplary partial scan scheme is shown, for example, in FIG. 1. Aside from the newly inserted justify pulse, this clocking scheme 100 can be similar to that of the traditional scan-based scheme, and can be implemented via simple clock gating. The shift pulses 102 can drive the scan flip-flops, the justify pulse 104 can drive the non-scan flip-flops, and the capture pulse(s) 106 can be received by both the scan and non-scan flip-flops. Compared to full scan testing, the same pattern can be applied to the circuit under test prior to the capture pulse(s), and with a careful feed of the observation points to the outputs/compactor/MISR, the same response may be observed. Both static (e.g., stuck-at) and dynamic (e.g., launch-off-capture at-speed) types of testing can be supported as can be seen, for example, in FIG. 1.

In such exemplary scheme, a non-scan flip-flop can receive an unintended value upon the justify pulse due to a defect in the functional path driving this flip-flop. While such a defect can result in the application of an unintended pattern to the circuit under test, and thus can be detected in the captured response, error masking may possibly yield a fault-free response. To prevent such a highly unlikely complication, (e.g., compacted) observation points can be observed also during the justify pulse, which can be when such a defect may first manifest in the non-scan flip-flop, in addition to the capture pulse.

Exemplary Test Cube Analysis

The simplicity of the exemplary partial scan scheme in justifying a non-scan flip-flop can facilitate a test cube analysis driven identification of flip-flops that can be converted to non-scan. In this test cube analysis, fault coverage typically remains intact. In other words, the test cube analysis can identify a subset of flip-flops to be converted to non-scan by ensuring that the test cubes can still be applied intact. Thus, the combinational ATPG process conducted to generate the test cubes is typically not repeated. Further, the exemplary test cube analysis can be applied as a post-ATPG process.

The test cubes of the exemplary design or configuration, which can represent the values to be loaded into the flip-flops of the circuit for detecting the faults of a particular type, can by denoted by TC[i][j], where $0 \leq i <$ Num_cubes and $0 \leq j <$ Num_inputs; TC[i][j] can denote the binary value of $j^{th}$ input (Primary Input (PI) or Pseudo-Primary Input (PPI)) in the $i^{th}$ test cube, Num_cubes can denote the number of test cubes, and Num_inputs can denote the total number of PIs and PPIs (PPIs correspond to the output of the flip-flops that drive the combinational logic). Further, a flip-flop justification cube, $JC_v[j]$ can be defined, which can denote the bit sequence for justifying a flip-flop j to a value v (0 or 1) through the functional paths, where $0 \leq j <$ Num_inputs.

A design fragment 200 including a single logic, cone is shown, for example, in FIG. 2 where the functional logic driving the rightmost flip-flop e (202) is shown. This flip-flop 202 can be justified to 1 by setting the leftmost flip-flop a (204) to 1, or be to 01. Similarly, ab=01 or ac=00 can set flip-flop e (202) to 0. The condition for justifying a flip-flop to a value can be similar to the detection condition for the fault on the D-input of the flip-flop that can be stuck-at the complementary value; the activation of the fault can necessitate the flip-flop to be justified to the value complementary to the stuck-at value, while there is no propagation requirement for the fault as the flip-flop can be an observable point. In other words, the test cube for the s-a-0 fault on the D-input of e can be 1xxxx or x01xx, which can denote the condition for justifying e to 1. Similarly, the test cube for the s-a-1 fault on the D-input of e (202) can be 01xxx or 0x0xx, which can denote the condition for justifying e to 0, as illustrated, for example, in FIG. 2. In this example, $JC_0[e]=$ 01xxx or 0x0xx, and $JC_{1[e]}=$1xxxx or x01xx. The justification information for each flip-flop can be actually embedded within the set of test cubes. An exemplary method 400 according to the present disclosure for performing the test cube analysis is shown in FIG. 4, the details of which are provided herein.

Single flip-flop conversion (402): There can be two conditions to be satisfied, for example, in order to convert a flip-flop f to non-scan:
  $JC_v[f]$ can be merged (two cubes can be merged together if the two cubes never have complementary values in the same bit position) with TC[i] for i such that TC[i][f]=v. In other words, there is preferably no 0-1 conflicts between a test cube that typically requires f to be at v, and the condition for justifying f to v.
  $JC_v[f][f]=x$ for v=0 and v=1. In other words, the justification condition for f preferably does not specify itself to a value, creating a circular dependency; if f is converted to non-scan, it can be justified by controlling other scan flip-flops, and not itself.

For the example above, flip-flop e (202) can be converted to non-scan if the first condition is met, as the second condition is satisfied for e; neither $JC_0[e]$ nor $JC_1[e]$ require e to be specified. If the test cubes that typically require e to be at 0 merge with $JC_0[e]$, and the test cubes that typically require e to be at 1 merge with $JC_1[e]$, then e can be converted to non-scan. For instance, a test cube 0x010, which specifies e as 0, can be compatible $JC_0[e]=$01xxx. Therefore, if 0101 is loaded into the other flip-flops a (204), b (206), c (208) and d (210) in four shift cycles, a subsequent justify pulse received by e (202) would load 0 into e (202), delivering the desired bits of the test cube into the flip-flops.

Pair conversion (404): It is possible that two flip-flops that can be converted individually cannot be converted together due to conflicting justification conditions. Next, exemplary conditions for converting two flip-flops $f_1$ and $f_2$ simultaneously are discussed:
  Single flip-flop conversion conditions can be met for both $f_1$ and $f_2$.
  $JC_{v1}[f_1]$ can be merged with $JC_{v2}[f_2]$, if $\exists_i$ such that $TC[i][f_1]=v_1$ and $TC[i][f_2]=v_2$. In other words, if the two bits corresponding to $f_1$ and $f_2$ are both specified by a test cube i, then the associated justification cubes of $f_1$ and $f_2$ is typically non-conflicting.
  $JC_v[f_1][f_2]=x$ and $JC_v[f_2][f_1]=x$ for v=0 and v=1. In other words, the justification cube for either flip-flop typically does not specify the other flip-flop, creating a circular dependency; if both flip-flops are converted non-scan, they can be justified by controlling other scan flip-flops, and not each other.

According to another exemplary embodiment of the present disclosure, it is possible to maximize the number of flip-flops converted to non-scan, as commensurate benefits in area cost, test time, test data volume, and test power dissipation can preferably be reaped. The single flip-flop conversion conditions can be used to identify the candidate flip-flops that can potentially be converted, while pair conversion condition can introduce a notion of compatibility between two flip-flops. This compatibility notion can be extended to a group of flip-flops, for example, as follows.

Group conversion (406): A group of flip-flops $f_k$ can be converted to non-scan, for example, if the following conditions hold:
  Single flip-flop conversion conditions are met for each flip-flop in the group.
  For each of the test cube TC[i] that specifies some of the bits in the group, the justification cubes corresponding to the specified flip-flops are preferably non-conflicting, and thus, mergeable.
  The justification cube for these flip-flops preferably does not specify any other flip-flops in the group.

For example, the group conversion can be a direct extension of pair conversion. Typically, if pair conversion conditions are met for every pair of flip-flops within a group, then the group conversion conditions typically automatically hold. The underlying reason can be the natural extension of pairwise to group compatibility of cube merge operations; for instance, if cubes $c_1$ and $c_2$, $c_1$ and $c_3$, and $c_2$ and $c_3$ can merge, then $c_1$, $c_2$ and $c_3$ can merge together.

The problem of identifying a maximal-sized group of flip-flops (408) that can be converted to non-scan can thus be mapped to the maximum independent set problem (see, e.g., R. E. Tarjan and A. E. Trojanowski, "Finding a maximum independent set," SIAM Journal of Computing, vol. 3, pp. 537-546, 1977). A conflict graph can be formed, wherein the nodes can correspond to the flip-flops that satisfy the single flip-flop conversion conditions. An edge that can denote a conflict can be inserted between two nodes that fail the pair conversion conditions. A maximal-sized group of independent nodes (e.g., an independent group of nodes denotes a group of nodes with no edge connecting any node to any other node in the group) can represent the pairwise compatible flip-flops, namely, a group of flip-flops that can be converted to non-scan. Since the independent set problem can be known to be NP-Complete, efficient heuristics can be utilized to identify near-optimal solutions.

The exemplary test cube analysis to create the conflict graph 300, on which the maximum independent set procedure can be executed, is illustrated, for example, on an example with 18 test cubes and seven flip-flops in FIG. 3. Out of the seven flip-flops, two of them, b and e, cannot meet the single flip-flop conversion conditions; $JC_0[b]$=01xx1x0 prefers b to be specified, and $JC_0[e]$=0xx1xx1 cannot be merged with the fourth test cube x0x10x0, which specifies e to be 0. The conflict graph can thus be formed with five nodes corresponding to the remaining flip-flops. In this graph, nodes a and g can be conflicting, as $JC_0[a]$=x1xxxx1 specifies g. Also, a and f can be conflicting, as the test cube 11x101x specifies both a and f as 1's, and $JC_1[a]$=xxx1xx0 and $JC_1[f]$=x10x0x1 cannot merge. The pair of flip-flops that can be compatible are a and c, as no test cube specifies both of them at the same time, and as their justification cubes do not specify each other. As a result, the maximum independent set can be a and c, both of which can be converted to non-scan by removing the two scan multiplexers.

The same figure can also show the bits to be loaded into the scan flip-flops b, d, e, f, and g; these new cubes can be obtained by merging the original test cubes with the justification cube of the non-scan flip-flop specified by the test cube, and by removing the bits of a and c. Each of the new test cubes typically requires five shift cycles, as opposed to seven, and a subsequent justify pulse received by a and c to load the desired values into these non-scan flip-flops. During shift cycles, five flip-flops (and their clock lines) can potentially toggle, while the other two flip-flops can preserve their values throughout the shift cycles as they are typically not clocked during this period of time.

Exemplary Experimental Results

Exemplary applications of the exemplary test cube analysis tool on a variety (ISCAS89 and ITC99) of academic benchmark circuits is discussed below, which mainly include the number of flip-flops that can be converted to non-scan without losing any fault coverage. While the exemplary analysis can be applied, with any underlying fault model, the exemplary application of the exemplary tool included test cubes of stuck-at faults.

Table 1 provides the exemplary results of the exemplary partial scan scheme. The first two columns provide the name of the benchmark circuit and the number of flip-flops, while column 3 presents the number of flip-flops that satisfy the single flip-flop conversion conditions and can thus be converted to non-scan individually; this number denotes the number of nodes in the conflict graph of the proposed test cube analysis. Column 4 presents the number of flip-flops that can be converted to non-scan, while column 5 provides the same number in percentage with respect to the number of flip-flops, and column 6 provides the run-time of the analysis. The number given in column 4 denotes the size of the maximally-sized independent set in the conflict graph.

TABLE 1

Single and multiple flip-flop conversion.

| | | Proposed scan to non-scan conversion | | | |
|---|---|---|---|---|---|
| Circuit | Flip-flops | Single | Multiple | (%) | Run-time (s) |
| s713 | 19 | 6 | 6 | 31.6 | <1 |
| s953 | 29 | 23 | 23 | 79.3 | <1 |
| s1423 | 74 | 2 | 2 | 2.7 | <1 |
| s3271 | 116 | 6 | 3 | 2.6 | <1 |
| s3330 | 132 | 93 | 52 | 39.4 | <1 |
| s3384 | 183 | 111 | 46 | 25.1 | <1 |
| s4863 | 104 | 102 | 48 | 46.2 | <1 |
| s5378 | 179 | 130 | 72 | 40.2 | <1 |
| s6669 | 239 | 193 | 86 | 36.0 | <1 |
| s9234 | 228 | 22 | 17 | 7.5 | <1 |
| s13207 | 669 | 283 | 202 | 30.2 | 5 |
| s15850 | 597 | 72 | 50 | 8.4 | 2 |
| s35932 | 1728 | 42 | 41 | 2.4 | 7 |
| s38417 | 1636 | 514 | 312 | 19.1 | 215 |
| s38584 | 1452 | 65 | 43 | 3.0 | 13 |
| b20 | 490 | 352 | 111 | 22.7 | 203 |
| b21 | 490 | 359 | 160 | 32.7 | 208 |
| b22 | 735 | 461 | 202 | 27.5 | 579 |

For s5378, for instance, the exemplary test cube analysis shows that 130 out of 179 flip-flops satisfy the single flip-flop conversion conditions, and can be converted to non-scan; 72 of these 130 flip-flops can be simultaneously converted to non-scan, as this group of 72 flip-flops (40.2%) satisfies the group conversion conditions.

The percentage flip-flop conversion ratio, provided in column 5, also denotes expected reductions in test time, test data volume, and test power. It can be difficult, however, to quantify the exact area cost savings, as the cost of the observation points depends on the scan configuration (e.g., number of POs, chains, and the compactor/MISR, if any); the savings due the scan multiplexers removed by the exemplary scheme can outweigh the cost of observation points, leading to overall area savings.

The exemplary results show that the exemplary test cube analysis approach can be capable of converting 30-40% of flip-flops to non-scan for seven circuits, while the conversion percentage can be poor (2-3%) in four circuits, from which two are small and two are among the largest, deducing no direct conclusions regarding the effectiveness versus size. For one circuit, 23 out of 29 flip-flops can be converted, resulting in almost 80% conversion ratio. For the remaining six circuits, the exemplary tool can attain around 8% conversion for two of the circuits, and 19-28% for the other four. The effectiveness of the exemplary test cube analysis approach can depend on the care bit distribution in test cubes and justification cubes, which reflects the cone structure and input-output connectivity of the design.

Other exemplary embodiments of the present disclosure can include the multiplicity of different conditions to justify a flip-flop to a value; the stuck-at fault at the input of the flip-flop can have multiple cubes detecting it. Various exemplary approaches can be taken to benefit from such a flexibility. The "best" cube can be selected for each justification condition in an effort to include more nodes (more flip-flops satisfying the single flip-flop conversion conditions) in the conflict graph or to have fewer edges (more pairs of flip-flops satisfying the pair conversion conditions) in the conflict graph. Alternatively, multiple justification cubes can be utilized for each flip-flop to increase the chances of satisfying the single flip-flop conversion conditions; as long as a compatible justification cube can be identified for each test cube, the single flip-flop conversion conditions are satisfied. In such a case, the pair and group conversion conditions need to be revised properly.

Yet another aspect of the present disclosure can include relaxing the principal that all test cubes can still be applied after the conversion thereby preserving fault coverage to tolerate a minor coverage loss, but in return to eliminate many conflicts in the graph, thereby increasing the number of scan to non-scan conversions.

Another exemplary embodiments of the present disclosure can include the re-formulation of the problem to prioritize performance savings. By removing the scan multiplexers from the critical paths, the functional performance of the design can be enhanced timing-wise. For this purpose, the exemplary framework can be extended to incorporate a timing analysis, prioritizing the removal of the multiplexers on critical paths, in addition to maximizing the number of other flip-flops that can be converted together.

Figure 5:
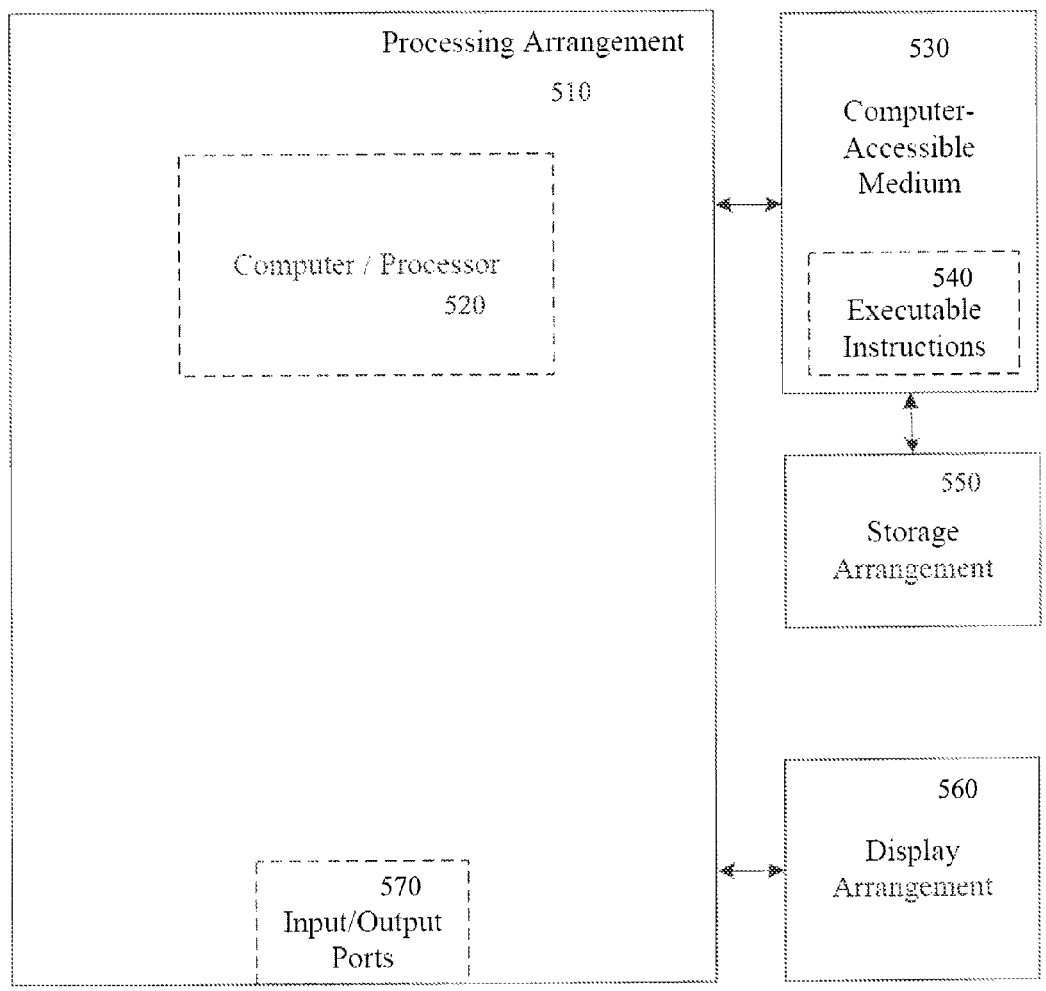
FIG. 5 is d block diagram of an apparatus according to a further exemplary embodiment of the present disclosure.

FIG. 5 shows an exemplary block diagram of an exemplary embodiment of a system according to the present disclosure. For example, the exemplary tool and/or procedures in accordance with the present disclosure described herein can be performed by a processing arrangement and/or a computing arrangement 510. Such processing/computing arrangement 510 can be, e.g., entirely or a part of, or include, but not limited to, a computer/processor 520 that can include, e.g., one or more microprocessors, and use instructions stored on a computer-accessible medium (e.g., RAM, ROM, hard drive, or other storage device).

As shown in FIG. 5, e.g., a computer-accessible medium 530 (e.g., as described herein above, a storage device such as a hard disk, floppy disk, memory stick, CD-ROM, RAM, ROM, etc., or a collection thereof) can be provided (e.g., in communication with the processing arrangement 510). The computer-accessible medium 530 can contain executable instructions 540 thereon. In addition or alternatively, a storage arrangement 550 can be provided separately from the computer-accessible medium 530, which can provide the instructions to the processing arrangement 510 so as to configure the processing arrangement to execute certain exemplary procedures, processes and methods, as described herein above, for example.

Further, the exemplary processing arrangement 510 can be provided with or include an input/output arrangement 570, which can include, e.g., a wired network, a wireless network, the internet, an intranet, a data collection probe, a sensor, etc. As shown in FIG. 5, the exemplary processing arrangement 510 can be in communication with an exemplary display arrangement 560, which, according to certain exemplary embodiments of the present disclosure, can be a touch-screen configured for inputting information to the processing arrangement in addition to outputting information from the processing arrangement, for example. Further, the exemplary display 560 and/or a storage arrangement 550 can be used to display and/or store data in a user-accessible format and/or user-readable format.

The foregoing merely illustrates the principles of the disclosure. Various modifications and alterations to the described embodiments will be apparent to those skilled in the art in view of the teachings herein. It will thus be appreciated that those skilled in the art will be able to devise numerous systems, arrangements, and procedures which, although not explicitly shown or described herein, embody the principles of the disclosure and can be thus within the spirit and scope of the disclosure. In addition, all publications and references referred to above can be incorporated herein by reference in their entireties. It should be understood that the exemplary procedures described herein can be stored on any computer accessible medium, including a hard drive, RAM, ROM, removable disks, CD-ROM, memory sticks, etc., and executed by a processing arrangement and/or computing arrangement which can be and/or include a hardware processors, microprocessor, mini, macro, mainframe, etc., including a plurality and/or combination thereof. In addition, certain terms used in the present disclosure, including the specification, drawings and claims thereof, can be used synonymously in certain instances, including, but not limited to, e.g., data and information. It should be understood that, while these words, and/or other words that can be synonymous to one another, can be used synonymously herein, that there can be instances when such words can be intended to not be used synonymously. Further, to the extent that the prior art knowledge has not been explicitly incorporated by reference herein above, it can be explicitly being incorporated herein in its entirety. All publications referenced can be incorporated herein by reference in their entireties.

What is claimed is:

1. A method for performing a partial-scan test of at least one integrated circuit, comprising:
   obtaining a plurality of test cubes including at least one justification cube of the at least one integrated circuit;
   identifying a plurality of scan flip-flops in the test cubes; and
   with a cube merging procedure, (i) identifying each previously-identified scan flip-flop of the integrated circuit that is individually convertible to a non-scan flip-flop, and (ii) performing the partial-scan test based on only the test cubes;
   wherein the identification procedure of each previously-identified scan flip-flop further includes identifying a particular previously-identified scan flip-flop (i) where there are no 0-1 conflicts between a particular test cube that requires the particular previously-identified scan flip-flop to be at a particular value and a particular justification cube associated with the particular previously-identified scan flip-flop for the particular value, and (ii) where the particular justification cube does not specify a bit of the particular previously-identified scan flip-flop to a 0 or a 1.

2. The method of claim 1, further comprising post-processing of the test cubes so as perform the partial-scan test based on only the test cubes.

3. The method of claim 1, wherein the partial-scan test includes a performance of a controllability and an observability associated with a full-scan test of the at least one integrated circuit.

4. The method of claim 1, wherein the at least one justification cube includes a plurality of justification cubes, and wherein the identification of each previously-identified scan flip-flop uses the justification cubes to justify each previously-identified scan flip-flop to a value and includes merging the justification cubes.

5. The method of claim 1, wherein the identification of each previously-identified scan flip-flop further includes identifying at least one pair of previously-identified scan flip-flops that is convertible to non-scanned flip-flops.

6. The method of claim 5, wherein identifying the at least one pair of previously-identified scan flip-flops includes merging the test cubes associated with the at least one pair of previously-identified scan flip-flops.

7. The method of claim 5, wherein the second identification of each previously-identified scan flip-flop further includes identifying at least one group of previously-identified scan flip-flops that is convertible to non-scanned flip-flops.

8. The method of claim 7, wherein identifying the at least one group of previously-identified scan flip-flops includes mapping the previously-identified scan flip-flops of the at least one group of previously-identified scan flip-flops onto a maximum independent set problem.

9. The method of claim 8, wherein mapping the previously-identified scan flip-flops onto the maximum independent set problem includes using a conflict graph.

10. The method of claim 5, wherein the identification of each previously-identified scan flip-flop further includes identifying the at least one pair of previously-identified scan flip-flops where (i) a previously-identified scan first flip-flop of the at least one pair of the previously-identified scan flip-flops and a second previously-identified scan flip-flop of the at least one pair of the previously-identified scan flip-flops are individually convertible into non-scanned flip-flops, (ii) a first justification cube associated with the first previously-identified scan flip-flop and a second justification cube associated with the second previously-identified scan flip-flop are non-conflicting when two bits corresponding to the first previously-identified scan flip-flop and the second previously-identified scan flip-flop are specified by a particular test cube, and (iii) a justification cube for one of the first previously-identified scan flip-flop or the second previously-identified scan flip-flop does not specify the other of the first previously-identified scan flip-flop or the second previously-identified scan flip-flop.

11. A non-transitory computer readable medium for performing a partial-scan test of at least one integrated circuit including instructions thereon that are accessible by a hardware processing arrangement, wherein, when the processing arrangement executes the instructions, the processing arrangement is configured to:
    obtain a plurality of test cubes including at least one justification cube of the at least one integrated circuit;
    identify a plurality of scan flip-flops in the test cubes; and
    with a cube merging procedure, (i) identify each previously-identified scan flip-flop of the integrated circuit that is individually convertible to a non-scan flip-flop, and (ii) perform the partial-scan test based on only the test cubes;
    wherein the identification procedure of each previously-identified scan flip-flop further includes identifying a particular previously-identified scan flip-flop (i) where there are no 0-1 conflicts between a particular test cube that requires the particular previously-identified scan flip-flop to be at a particular value and a particular justification cube associated with the particular previously-identified scan flip-flop for the particular value, and (ii) where the particular justification cube does not specify a bit of the particular previously-identified scan flip-flop to a 0 or a 1.

12. The non-transitory computer readable medium of claim 11, wherein the non-transitory computer readable medium is further configured to perform a post-processing of the plurality of test cubes so as perform the partial-scan test based on only the test cubes.

13. The non-transitory computer readable medium of claim 11, wherein the partial-scan test includes a performance of a controllability and an observability associated with a full-scan test of the at least on integrated circuit.

14. The non-transitory computer readable medium of claim 11, the at least one justification cube includes a plurality of justification cubes, and wherein identifying each previously-identified scan flip-flop uses the justification cubes to justify each previously-identified scan flip-flop to a value and includes merging the plurality of justification cubes.

15. The non-transitory computer readable medium of claim 11, wherein the identification of each previously-identified scan flip-flop further includes identifying at least one pair of previously-identified scan flip-flops that is convertible to non-scanned flip-flops.

16. The non-transitory computer readable medium of claim 15, wherein identifying the at least one pair of previously-identified scan flip-flops includes merging the test cubes associated with the at least one pair of previously-identified scan flip-flops.

17. The non-transitory computer readable medium of claim 15, wherein the identification of each previously-identified scan flip-flop further includes identifying at least one group of previously-identified scan flip-flops that is convertible to non-scanned flip-flops.

18. The non-transitory computer readable medium of claim 17, wherein identifying the at least one group of previously-identified scan flip-flops includes mapping the previously-identified scan flip-flops of the at least one group of previously-identified scan flip-flops onto a maximum independent set problem.

19. The non-transitory computer readable medium of claim 18, wherein mapping the previously-identified scan flip-flops onto the maximum independent set problem includes using a conflict graph.

20. The computer-readable medium of claim 15, wherein the identification of each previously-identified scan flip-flop further includes identifying the at least one pair of previously-identified scan flip-flops where (i) a first previously-identified scan flip-flop of the at least one pair of the previously-identified scan flip-flops and a second previously-identified scan flip-flop of the at least one pair of the previously-identified scan flip-flops are individually convertible into non-scanned flip-flops, (ii) a first justification cube associated with the first previously-identified scan flip-flop and a second justification cube associated with the second previously-identified scan flip-flop are non-conflicting when two bits corresponding to the first previously-identified scan flip-flop and the second previously-identified scan flip-flop are specified by a particular test cube, and (iii) a justification cube for one of the first previously-identified scan flip-flop or the second previously-identified scan flip-flop does not specify the other of the previously-identified scan first flip-flop or the second previously-identified scan flip-flop.

21. A partial-scan test hardware architecture of an integrated circuit, comprising:
    at least one scan flip-flop identified using a plurality of test cubes obtained using a cube merging procedure to identify each previously-identified scan flip-flop of the integrated circuit that is individually convertible to a non-scan flip-flop and perform the partial-scan test based on only the test cubes;

wherein the identification of each previously-identified scan flip-flop further includes identifying a particular previously-identified scan flip-flop (i) where there are no 0-1 conflicts between a particular test cube that requires the particular previously-identified scan flip-flop to be at a particular value and a particular justification cube associated with the particular previously-identified scan flip-flop for the particular value, and (ii) where the particular justification cube does not specify a bit of the particular previously-identified scan flip-flop to a 0 or a 1.

22. The test architecture of claim 21, wherein the partial-scan test includes a performance of a controllability and an observability associated with a full-scan test of the at least one integrated circuit.

23. The test architecture of claim 21, wherein the test cubes include a plurality of justification cubes, and wherein identifying each previously-identified scan flip-flop includes using the justification cubes to justify each previously-identified scan flip-flop to a value and merging the justification cubes.

24. The test architecture of claim 21, wherein the second identification procedure of each previously-identified scan flip-flop further includes identifying at least one pair of previously-identified scan flip-flops that is convertible to non-scanned flip-flops.

25. The test architecture of claim 24, wherein identifying the at least one pair of previously-identified scan flip-flops includes merging the test cubes associated with the at least one pair of previously-identified scan flip-flops.

26. The test architecture of claim 24, wherein the identification of each previously-identified scan flip-flop further includes identifying at least one group of previously-identified scan flip-flops that is convertible to non-scanned, flip-flops.

27. The test architecture of claim 26, wherein identifying the at least one group of previously-identified scan flip-flops includes mapping the previously-identified scan flip-flops of the at least one group of previously-identified scan flip-flops onto a maximum independent set problem.

28. The test architecture of claim 27, wherein mapping the previously-identified scan flip-flops onto the maximum independent set problem includes using a conflict graph.

29. The test architecture of claim 24, wherein the identification of each previously-identified scan flip-flop further includes identifying the at least one pair of previously-identified scan flip-flops where (i) a first previously-identified scan flip-flop of the at least one pair of the previously-identified scan flip-flops and a second previously-identified scan flip-flop of the at least one pair of the previously-identified scan flip-flops are individually convertible into non-scanned flip-flops, (ii) a first justification cube associated with the first previously-identified scan flip-flop and a second justification cube associated with the second previously-identified scan flip-flop are non-conflicting when two bits corresponding to the first previously-identified scan flip-flop and the second previously-identified scan flip-flop are specified by a particular test cube, and (iii) a justification cube for one of the first previously-identified scan flip-flop or the second previously-identified scan flip-flop does not specify the other of the first previously-identified scan flip-flop or the second previously-identified scan flip-flop.

30. A system for performing a partial-scan test of at least one integrated circuit, comprising:
   a computing arrangement configured to:
      obtain a plurality of test cubes including at least one justification cube of the at least one integrated circuit
      identify a plurality of scan flip-flops in the test cubes; and
      with a cube merging procedure, (i) identify each previously-identified scan flip-flop of the integrated circuit that is individually convertible to convert to a non-scan flip-flop, and (ii) perform the partial-scan test based on only the test cubes;
   wherein the identification of each previously-identified scan flip-flop further includes identifying a particular previously-identified scan flip-flop (i) where there are no 0-1 conflicts between a particular test cube that requires the particular previously-identified scan flip-flop to be at a particular value and a particular justification cube associated with the particular previously-identified scan flip-flop for the particular value, and (ii) where the particular justification cube does not specify a bit of the particular previously-identified scan flip-flop to a 0 or a 1.

* * * * *